US012200086B2

(12) United States Patent
Kamir et al.

(10) Patent No.: US 12,200,086 B2
(45) Date of Patent: Jan. 14, 2025

(54) METHOD FOR COMPRESSING CAN-BUS DATA

(71) Applicant: ENIGMATOS LTD., Yavne (IL)

(72) Inventors: Eyal Kamir, Ganei Tikva (IL); Alexander Fok, Rehovot (IL); Liran Zwickel, Or Yehuda (IL)

(73) Assignee: ENIGMATOS LTD., Yavne (IL)

( * ) Notice: Subject to any disclaimer, the term of this patent is extended or adjusted under 35 U.S.C. 154(b) by 325 days.

(21) Appl. No.: 17/638,097

(22) PCT Filed: Aug. 30, 2020

(86) PCT No.: PCT/IL2020/050939
§ 371 (c)(1),
(2) Date: Feb. 24, 2022

(87) PCT Pub. No.: WO2021/038570
PCT Pub. Date: Mar. 4, 2021

(65) Prior Publication Data
US 2022/0303362 A1 Sep. 22, 2022

Related U.S. Application Data

(60) Provisional application No. 63/026,162, filed on May 18, 2020, provisional application No. 62/893,192, filed on Aug. 29, 2019.

(51) Int. Cl.
*H04L 69/04* (2022.01)
*G06F 13/36* (2006.01)
(Continued)

(52) U.S. Cl.
CPC .............. *H04L 69/04* (2013.01); *G06F 13/36* (2013.01); *H04L 12/40* (2013.01); *H04L 67/12* (2013.01);
(Continued)

(58) Field of Classification Search
CPC ......... H04L 69/04; H04L 12/40; H04L 67/12; H04L 69/22; H04L 2012/40215;
(Continued)

(56) References Cited

U.S. PATENT DOCUMENTS 10,701,102 B2* 6/2020 Zeng ..................... H04L 63/062
2009/0300039 A1* 12/2009 Stengelin ................ H03M 7/30
(Continued)

FOREIGN PATENT DOCUMENTS

CN 105099843 11/2015

OTHER PUBLICATIONS

An Adaptive Data-Reduction Protocol for the Future In-Vehicle Networks. Sae Technical Paper Series (Retrieved on Oct. 26, 2020). Retrieved from the Internet: https://pdfs.semanticscholar.org/5adc/ea0ccf267f64bfbce16365dd0c49f92ad973.pdf; Ramteke, P. and Mahmud, S., Apr. 11, 2005 (Apr. 11, 2005).
(Continued)

*Primary Examiner* — Shean Tokuta
*Assistant Examiner* — Juan C Turriate Gastulo
(74) *Attorney, Agent, or Firm* — Snell & Wilmer L.L.P.

(57) ABSTRACT

A method for compressing a flow of CAN-bus messages, which comprises: (A) during a training stage: (a) determining at least one series-type pattern; (b) defining a compressed series-type command for each of said patterns, each command comprising parameters of: (b.1) a timestamp of a first message; (b.2) a message-ID; (b.3) a type of pattern; (b.4) an indication of a field within the messages; (b.5) a parameter value at the first message; (b.6) period between messages; and (b.7) number of messages; (B) during a compression stage: (c) dividing a record of CAN-bus messages into groups of a same message-ID; (d) within each group, finding messages of a same pattern; (e) for each series, forming a compressed command in a form as defined
(Continued)

with values for at least several parameters; and (C) during a decompression stage: (f) using the series-type compressed commands to reconstruct the content of the series of messages.

16 Claims, 7 Drawing Sheets

(51) Int. Cl.
  *H04L 12/40* (2006.01)
  *H04L 67/12* (2022.01)
  *H04L 69/22* (2022.01)

(52) U.S. Cl.
  CPC .... *H04L 69/22* (2013.01); *H04L 2012/40215* (2013.01); *H04L 2012/40273* (2013.01)

(58) Field of Classification Search
  CPC ........... H04L 2012/40273; H04L 69/12; H04L 12/40071; G06F 13/36; H03M 7/3073; H03M 7/70; H03M 7/3077
  See application file for complete search history.

(56) References Cited

U.S. PATENT DOCUMENTS

| | | | |
|---|---|---|---|
| 2017/0092018 A1 | 3/2017 | Throop et al. | |
| 2018/0241852 A1* | 8/2018 | Maluf | H04L 67/12 |
| 2019/0141133 A1 | 5/2019 | Rajan et al. | |
| 2019/0385057 A1* | 12/2019 | Litichever | H04L 63/14 |
| 2020/0053112 A1* | 2/2020 | Torisaki | H04L 67/12 |
| 2021/0274010 A1* | 9/2021 | Stein | H04L 67/5651 |
| 2022/0159098 A1* | 5/2022 | Stein | H03M 7/707 |
| 2023/0275877 A1* | 8/2023 | Harel | G01C 21/3822 |
| | | | 713/189 |

OTHER PUBLICATIONS

Memory-aware Online Compression of CAN Bus Data for Future Vehicular Systems. (Retrieved on Oct. 26, 2020). Retrieved from the Internet: https://pure.au.dk/portal/files/194854433/main.pdf; Yazdani, N. et al., Jul. 20, 2020 (Jul. 20, 2020).

International Search Report and Written Opinion issued on Oct. 28, 2020 in International Patent Application No. PCT/IL2020/050939 (9 pages, in English).

* cited by examiner

Fig. 5

METHOD FOR COMPRESSING CAN-BUS DATA

CROSS-REFERENCE TO RELATED APPLICATIONS

This application is a United States national-stage application of International Application No. PCT/IL2020/050939, filed Aug. 30, 2020, which claims priority to U.S. Provisional App. No. 63/026,162, filed May 18, 2020, and claims priority to U.S. Provisional App. No. 62/893,192, filed Aug. 29, 2019. The contents of the PCT patent application and the U.S. Provisional patent applications are incorporated herein by reference in their entireties.

FIELD OF THE INVENTION

The invention relates in general to methods and systems for monitoring, maintaining, and protecting a vehicle's computerized system such as CAN-bus. More specifically, the invention relates to a system and method for efficient delivery of CAN-bus data to an external unit.

BACKGROUND OF THE INVENTION

The vehicle is a complex network of computers on the move—today's vehicles have dozens (in many cases more than 50) of Electronic Control Units (ECU's) and more than 100M code lines. Today's cars are already designed to communicate with one another, with road signs, with traffic lights, with the manufacturer's server, and more. To allow all these operations, the necessity for a reliable vehicle's computerized system becomes extremely important.

The Controller Area Network (CAN-bus) is the most common and robust vehicle bus standard designed to allow microcontrollers and devices to communicate with each other in applications without a host computer. Other protocols that are used on board of a vehicle are, for example, Can-FD, Flexray, and Automotive Ethernet Standards. The CAN-bus is a message-based protocol, designed for multiplex electrical wiring within automobiles. The CAN-bus allows communication between a plurality of Electronic Control Units (ECUs) also known as nodes. Two or more nodes are required on the CAN network to communicate. The complexity of the node can range from a simple I/O device up to an embedded computer with a CAN interface and sophisticated software. The node may also be a gateway allowing a general-purpose computer (such as a laptop or maintenance apparatus) to communicate over a USB or Ethernet port to devices on a CAN network. All the nodes of the CAN-bus are typically connected to the bus through a two-wire connection. The wires are a twisted pair with a 120Ω (nominal) characteristic impedance.

Each node in the CAN-bus is configured of sending and receiving messages, but not simultaneously. A CAN-bus message primarily consists of a message-identifier, up to eight data bytes, a CRC, acknowledge slot (ACK), and other overhead slots that are a part of the message. The improved CAN FD protocol extends the length of the data field of the message to up to 64 bytes per frame. The message is transmitted serially onto the bus using a non-return-to-zero (NRZ) format and may be received by all nodes. The devices that are connected by a CAN network are typically sensors, actuators, and other control devices. These devices are connected to the bus through a host processor, a CAN controller, or a CAN transceiver (all referred to herein as "ECUs").

To monitor and secure the safety and integrity of the CAN-bus, and to perform maintenance, some safety and maintenance programs apply a frequent record of the traffic on the network and export of the traffic record either wirelessly to a remote control-center or cloud entity (e.g., by mobile communication), or by hardwire-communication to a local maintenance apparatus. Each of the 50-100 ECUs of the CAN-bus issues a periodic transmission in a period order of a few μs and up to several tens of μs (with some exceptions that will be discussed below). Hundreds or even thousands of different messages are transmitted each second. A single CAN-C network segment of bandwidth 1 Mb/s can generate about 10 MB of data per day. Modern vehicles can include 5-10 of such network segments, generating 50-100 MB of data per day per vehicle. The recently introduced CAN FD protocol, when used, further increases this transmission size by several orders. Uploading and storing such an amount of data for a fleet of vehicles is a challenging issue, even with nowadays public cloud infrastructures and 4G cellular technology penetration. In some cases, a necessity also arises to store a long record of CAN-bus data locally (i.e., within the vehicle) for future verification. In all the above cases a necessity for efficient compression is desired.

The prior art has proposed two main approaches for compressing or reducing data of CAN-bus messages. The syntactic compression approach operates on a low-level representation of the byte-stream data and performs irrespective of the specific meaning of the content. The semantic compression approach interprets the data which is compressed and takes advantage of its specific meaning to compress the data.

Andras Gazdag et. al., "*Efficient Lossless Compression of CAN Traffic Logs*", 25th International Conference on Software, Telecommunications and Computer Networks (SoftCOM), September 2017, suggests a semantic compression approach for CAN-bus data.

It is an object of the present invention to provide a method for significantly reducing the size of files containing CAN-bus recorded messages, thereby allowing an efficient delivery and storage of the files to a remote control-center or a maintenance apparatus.

SUMMARY OF THE INVENTION

The invention relates to a method for compressing a flow of CAN-bus messages, which comprises: (A) during a training stage: (a) determining at least one series-type pattern within a training flow of messages, each series-type pattern spanning data values that appear in a data field of a sequential series of CAN-bus messages having the same message-ID; (b) defining a compressed series-type command for each of said patterns, each series type command comprising the parameters of: (b.1) a timestamp of a first message in the series; (b.2) a message-ID of the series; (b.3) a type of pattern; (b.4) an indication of a field or a portion thereof within the messages where the pattern appears; (b.5) a parameter value at the first message in the series; (b.6) period between messages of the series; and (b.7) number of messages in the series;

(B) during a compression stage:

(c) dividing a record of a flow of CAN-bus messages into groups, each group relating to messages having the same message-ID; (d) within each group, finding one or more series of messages of a same pattern, each series spanning at least 5 messages; (e) for each said found series of messages, forming a series-type compressed command in a form as defined in the training stage, said compressed series-type command comprising values for at least several of the parameters as defined for that command during the training stage; and (C) during a decompression stage:

(f) using each said series-type compressed command to reconstruct at least a portion of the content of a respective series of messages, wherein said compressed command populates respective values within a respective field or a portion thereof of each individual of said reconstructed messages.

In one embodiment, the pattern type is a function appearing within a data field of the message or within a portion thereof.

In one embodiment, the function is a counter or a data-field CRC causing respectively a pattern of values to appear within data fields or portion thereof of consecutive messages, and wherein the decompression stage populates said values within respective fields of the reconstructed series of messages.

In one embodiment, the pattern type is a constant value appearing within a data field of a message or within a portion thereof, and wherein the decompression stage populates said constant value within respective fields of the reconstructed series of messages.

In one embodiment, the training stage further comprising: (a) a step of determining a plurality of constant values that statistically repeat many times in data fields of messages or portions thereof; (b) a step of sequentially indexing constants that most commonly appear; and (c) wherein each constant-type command during the compression stage contains an index of the constant rather than the constant itself.

In one embodiment, the method further comprising: (a) a step of indexing all the IDs in the training flow of the CAN-bus messages in sequential order; and (b) during the compression stage inclusion within each compressed command the index of the ID, rather than a true message-ID as originally appears on the CAN-bus.

In one embodiment, the method further comprising an inclusion within a series-type compressed command of one or more delay indications relative to an expected timestamp based on a known period between commands in that respective series.

In one embodiment, the method further comprising one or more compressed commands for introducing one or more specific values within data fields of individual reconstructed messages.

In one embodiment, a different compressed command is assigned for each pattern, rather than indicating the pattern as a parameter value within the compressed command.

In one embodiment, the decompression of the compressed commands uses metadata that is conveyed from the compression location to the decompression location.

In one embodiment, the metadata contains indexing information of the message-IDs, indexing information of constants, and whenever necessary, details about specific functions behavior (for example, the data-field CRC function), thereby to enable the decompression side to appropriately convert the function in the command to data values within data fields of different reconstructed messages.

DETAILED DESCRIPTION OF PREFERRED EMBODIMENTS

The following description of the disclosed invention is not necessarily limited in its application to the details of construction and the arrangement of the components and/or methods/processes outlined in the following description and/or illustrated in the drawings.

As will be appreciated by one skilled in the art, aspects of the present disclosure may be embodied as a system, methods/processes or computer program or products. Accordingly, aspects of the present disclosure may take the form of an entirely hardware embodiment, an entire software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more non-transitory computer-readable (storage) medium(s) having computer readable program code embodied thereon.

An embodiment is an example or implementation of the disclosed invention. The various appearances of "one embodiment," "an embodiment" or "some embodiments" do not necessarily all refer to the same embodiment. Although various features of the disclosed invention may be described in the context of a single embodiment, the features may also be provided separately or in any suitable combination. Conversely, although the disclosed invention may be described herein in the context of separate embodiments for clarity, the disclosed invention may also be implemented in a single embodiment.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the disclosure. It is understood that the phraseology and terminology employed herein are not to be construed as limiting and are for descriptive purpose only.

The following description, while being specifically referred to CAN-C protocol, is also applicable, mutatis mutandis to the CAN-FD protocol as well.

Throughout this document, if and when numerous textual and graphical references are made to trademarks and domain names. These trademarks and domain names are the property of their respective owners and are referenced only for explanation purposes herein.

Figure 1A:
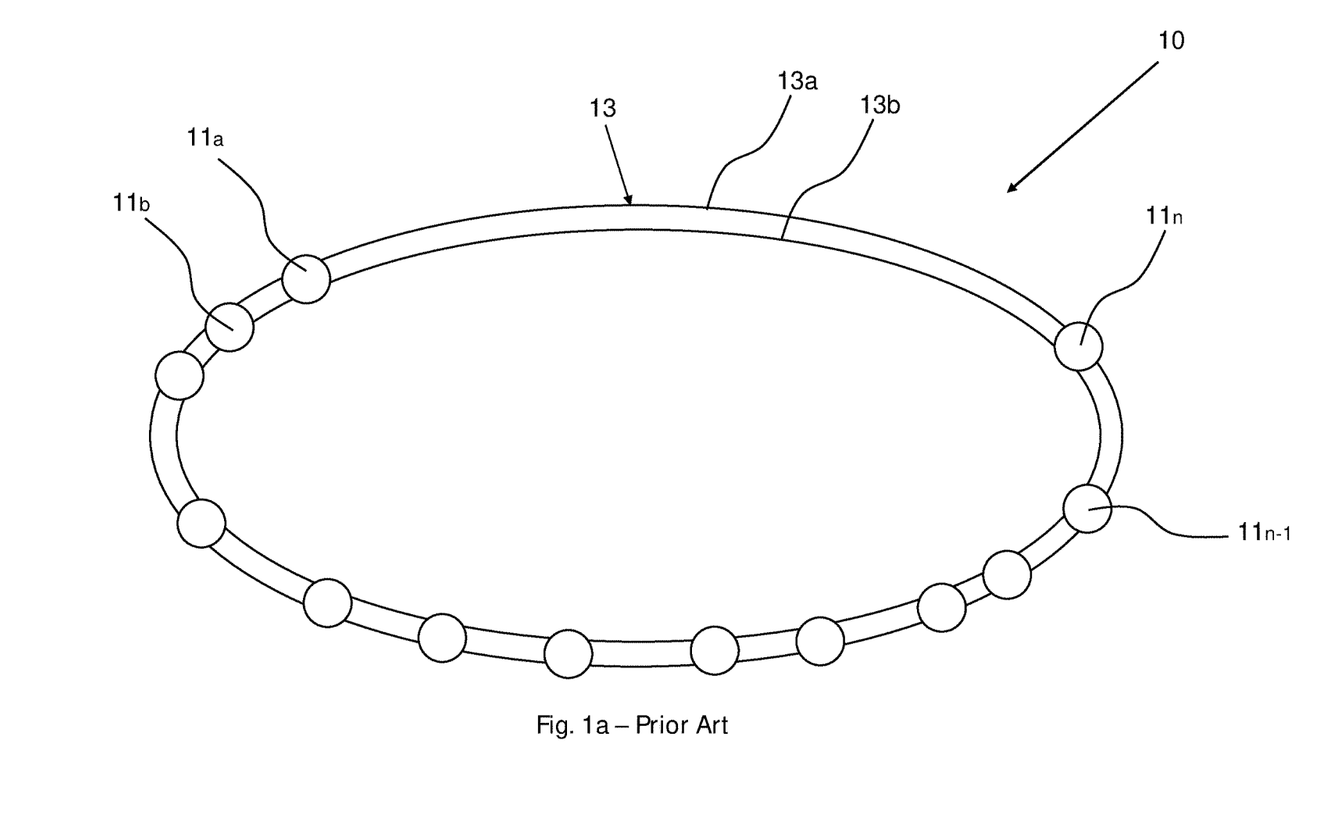
FIG. 1a generally illustrates a structure of a prior art CAN-bus, according to the prior art.

FIG. 1a generally illustrates in schematic form a typical computerized subsystem of a vehicle. The subsystem 10 comprises a plurality of ECUs (also known as "nodes") 11a-11n, each controlling or monitoring the status of one or more devices or schemes of the vehicle, such as the gas pedal, the brakes pedal, the steering wheel, the cabin temperature, the airbags, the gear states, etc. The vehicle may include tens of such ECUs, while the ECUs 11a-11n communicate with one another and with the relevant controlled or monitored devices or schemes via the CAN-bus 13.

Figure 1B:
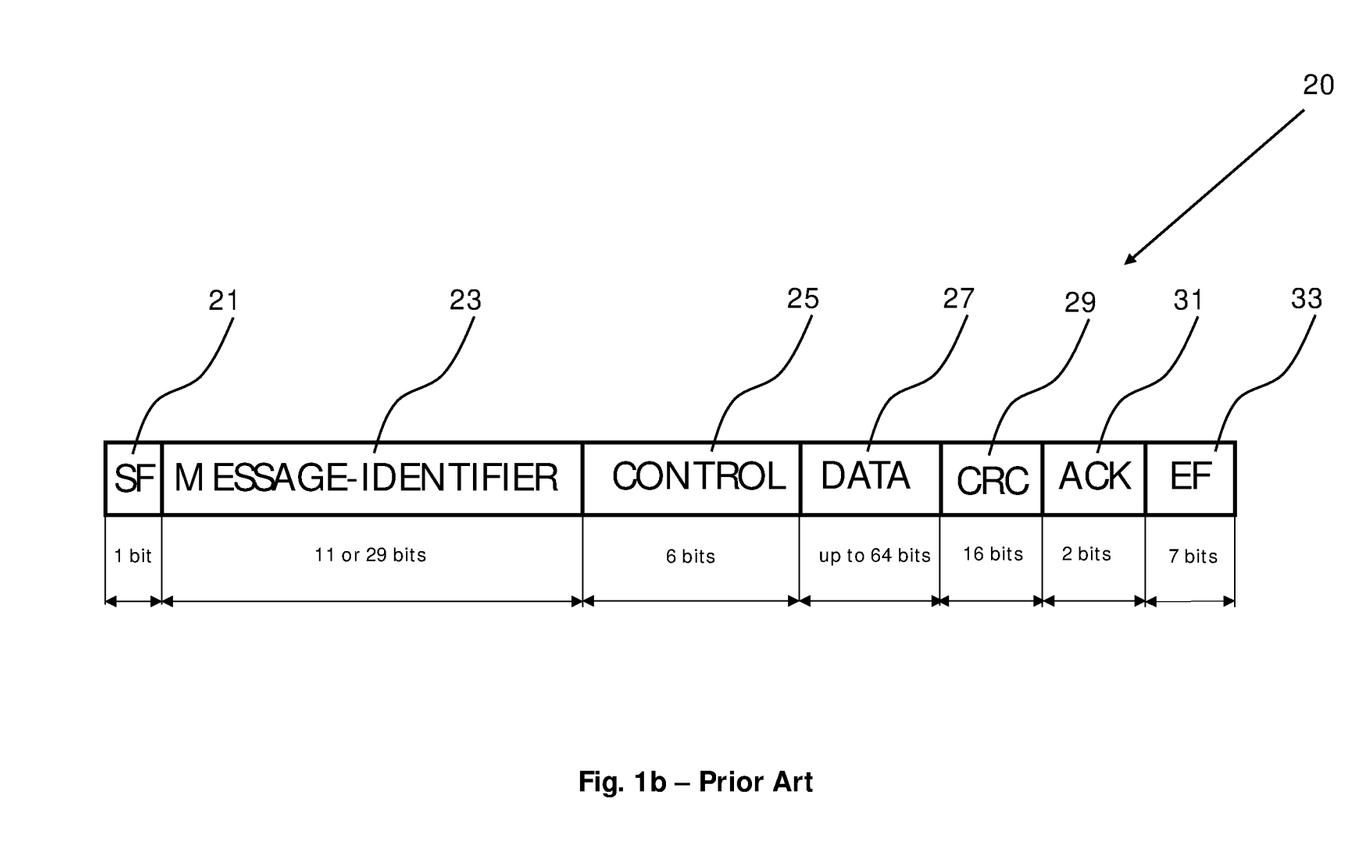
FIG. 1b generally illustrates the structure of a CAN-bus message, according to the prior art.

The CAN-bus 13 is a message-based protocol. Reference is made to FIG. 1b that schematically depicts the structure of a CAN-bus message 20. The message 20 includes the following fields: SF (Start of Field) 21, Message-Identifier 23, Control 25, Data 27, CRC 29 Ack 31, and EF (End of Frame) 33. The Message-Identifier 23 typically defines the type of the message (for example, airbag message, gear control message, wheel drive message, etc.) and the level of priority of the identifier within the data protocol. In fact, the message-identifier defines to some degree the originator of the message (as each ECU may use either one or several different message-IDs). Depending on a specific format being used, the length of the Message-identifier can be either 11-bits (two bytes) in a standard format, or 29-bits (four bytes) in an extended CAN-bus format. The SF field 21 indicates which of the two formats (11 or 29 bits) is used for the message-identifier. The Control Field 25, also known as the Check Field, displays the number of items of information contained in the data field. The Control field allows any receiver of the message to check whether the received message has all the information transferred. The Data Field 27 whose length ranges between 0 to 8 bytes, contains the actual information transmitted on the bus 13, namely the information that can be read by any other ECU 11. The CRC field 30 is a Cyclic Redundancy Check field, that contains a 15-bits cyclic redundancy check code. The ACK Field 32, namely the Acknowledge Field, allows any receiver of the transmitted message to signal to the message-originator that it has correctly received a message. If an error is detected, the receiver notifies the message originator immediately. The message originator may then resend the message. The terms "car" and "vehicle" are used herein interchangeably.

As noted above, to monitor and secure the safety and integrity of the CAN-bus, and to perform maintenance, there is a frequent necessity to record at least a portion of the traffic on the network and to export this record of traffic either wirelessly to a remote control-center (by mobile communication), or by hardwire connection to a local maintenance apparatus. Each of the 50-100 ECUs of the vehicle issues its message transmission periodically in the order of a message per several µs to several tens of µs. Hundreds or even thousands of different messages are typically transmitted each second. A single CAN-C network segment of bandwidth 1 Mb/s can generate about 10 MB of data per day. Modern vehicles can contain 5-10 of such network segments, generating 50-100 MB of data per day per vehicle. The recently introduced CAN-FD protocol increases this transmission size by several orders. The uploading and storing such an amount of record data for a fleet of vehicles is a challenging issue, even with nowadays public cloud infrastructures and 4G cellular technology penetration. The present invention provides a compression method, that enables a very significant reduction of the recorded data, and a recovery of the compressed-transmitted record at the remote monitoring center or at the maintenance apparatus (hereinafter, for a sake of simplicity the following description will assume a case of a remote monitoring center, however, the same method is likewise applicable also to the case of a hardwire-connected maintenance apparatus).

The CAN-bus traffic is in fact a sequence of messages. Each ECU in the CAN-bus typically issues its own messages, with its own message-ID, in a constant period as defined for it (with a few exceptions). There are cases in which two ECUs try to simultaneously introduce their own messages on the bus. To overcome this conflict, the CAN-bus protocol has an arbitration procedure that gives priority to the message having a lower message-ID. The "rejected" ECU then reissues its "rejected" message immediately thereafter. Therefore, while in many cases one may predict the time when a next message will be issued by a specific ECU, when an issued message is "rejected" due to said simultaneous-type conflict, the issue time of all the next messages of this specific ID will be delayed once, while still the period for the next messages is maintained.

It has been concluded by the inventors that in order to monitor a record of messages, the remote control-center can be satisfied in many cases by the following three message fields: (a) a timestamp indicating the time of appearance of each message on the bus (the time-stamp is in fact not a part of the original CAN-bus transmitted message, but should be added thereafter for inspection and monitoring purposes); (b) the message-ID (originally, two or four bytes); and (c) the data field (originally up to 8 bytes). The rest of the fields of the original message typically include only control data for a local appropriate operation of the network segment and are not required for vehicle monitoring applications such as security, predictive maintenance, or other data-driven external applications. This observation should not limit the invention, as in some cases additional fields from the original message may be required at the remote control station, and therefore they may be included within the transfer to the remote location.

The inventors have found that the fact that a vast amount of the CAN-bus messages is based on several predefined functions, whose values are substituted, respectively, within the data field of the message or a portion thereof, can be utilized as a basis for very efficient compression, particularly when it becomes necessary to transfer the data to a remote location. For example, many of the CAN-bus messages utilize the following functions:

(a) Counter: Many consecutive messages apply a counter in their data field. In some cases, the counter occupies a portion of the data field (for example, 2 bytes), in other cases, the counter occupies the entire data field. When a counter is observed, a single compressed command can describe, for example, 500 consecutive CAN-bus counter-type messages, by including the value of the counter in the first message instance, and the number of sequential appearances. By sending this information within the compressed command, each and every CAN message within the data set forming these exemplary 500 messages can be reconstructed at the remote location based on this single compressed command.

(b) Constants: Many CAN-bus messages include constant values in their data field, or a part thereof, namely: at least several bytes within the data field are repeated many times in many messages. Therefore, if these bytes that are found to be repeated many instances are indexed in a pre-operational state, a full (or partial) data field can be designated by an alternative index of a few-bits size in the compressed command which is sent to the remote location.

(c) Data-field CRC (The term "Data-field CRC" refers to a CRC code which appears within a portion of the data field, for example, within a single byte of the data field, and is distinguish from the "message-CRC" for which two bytes within the message frame are assigned as a standard-field in the CAN-bus message): In addition to the two-byte field of message-CRC which is technically used by a receiving ECU to validate that all the message has been appropriately transferred over the local bus and received, there are many cases in which one or more bytes within the data field are additionally used to authenticate the message. The data-field CRC is a product of a function that is internally known to all the ECUs in the CAN-bus, and all the ECUs operate with the same predefined function to create and authenticate, respectively, the message. If this function data-field is known, and the data-field CRC values are found within messages of the CAN-bus, it is sufficient to report this CRC function only once (for a specific series of messages, or all the messages involved) in a compressed command to the remote monitoring center, and this report is sufficient for the receiving monitoring center to reconstruct the many data-field CRCs, and to substitute them within the reconstructed messages at the remote monitoring center.

(d) Other functions: There are other functions, either proprietary or standard that are applied within CAN-bus messages, some of them are case-specific, i.e., depend on the specific manufacturer, on the model, etc., others are standard in all the vehicles. All these functions, if known, can be used in the single newly-created compressed command to describe many data fields that appear in consecutive or non-consecutive messages on the CAN-bus.

To summarize, when the function is known, data fields (or portions thereof) even of 50,000 messages can be described by a single line of a newly-constructed compressed command, and those data-fields can be reconstructed at the remote location based on this compressed command.

The message-identifier field, which generally occupies 2 to 4 bytes can also be compressed. Typically, a CAN-bus contains up to 100 ECUs, and each ECU may issue at most a few different message-identifiers. Therefore, even though the various message-identifiers span up to 4 bytes (as they are not sequential), they can be indexed to form a sequential list that occupies about 6 to 7 bits (i.e., less than a byte size).

Figure 2:
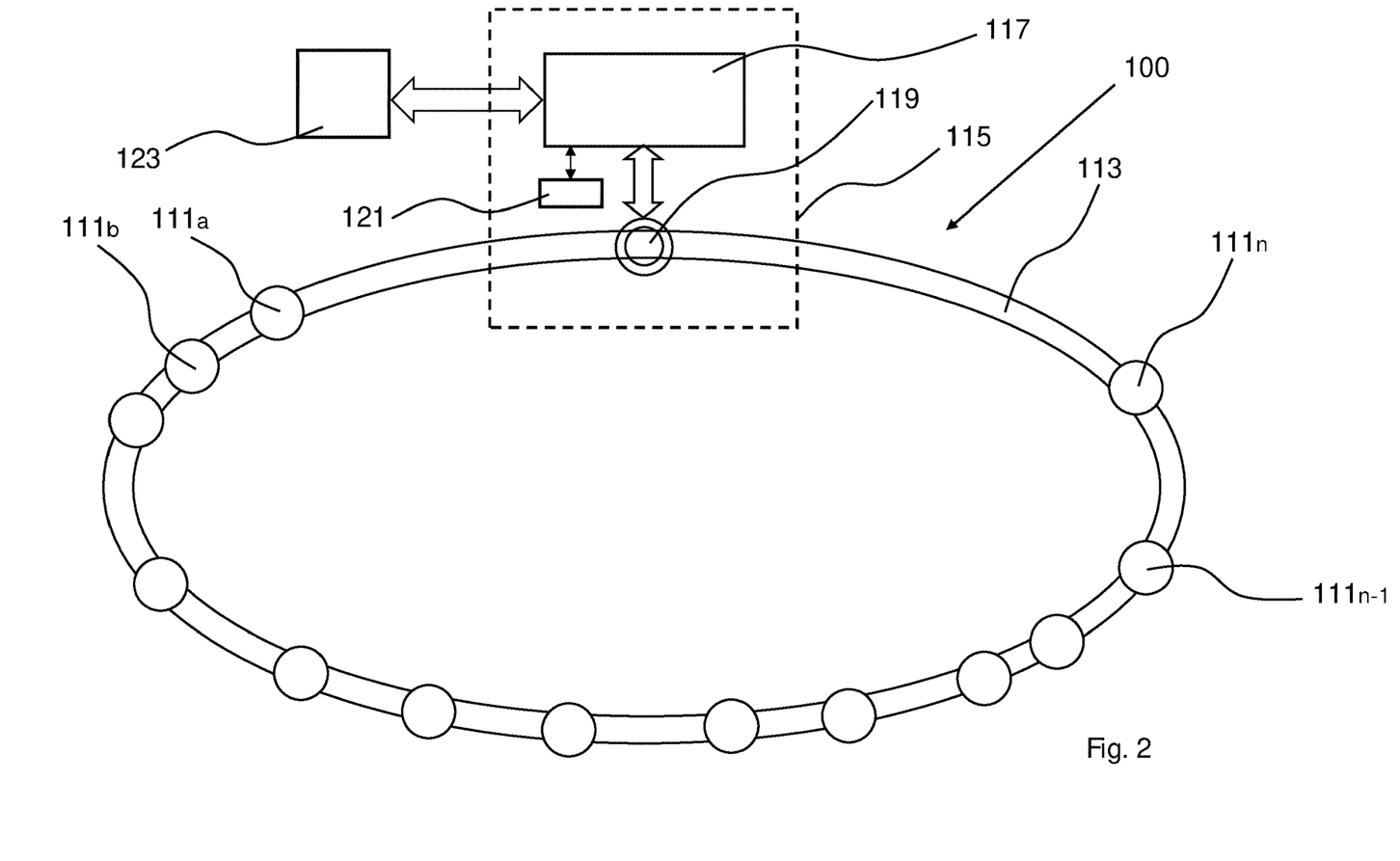
FIG. 2 generally illustrates a structure of a CAN-bus, according to an embodiment of the invention.

FIG. 2 illustrates in a general schematic form a computerized subsystem of a vehicle, according to an embodiment of the invention. In similarity to the prior art subsystem 10, the subsystem 100 of the invention comprises a plurality of ECUs 111a-111n, each controlling status of one or more devices or schemes of the vehicle, such as the gas pedal, the brakes pedal, the steering wheel, the cabin temperature, the airbags, etc. The ECUs 111a-111n communicate with one another or with a respective controlled or monitored devices or schemes over the CAN-bus 113. In addition, the subsystem 100 includes a compression unit 115. Compression unit 115, which may have a form of an ECU, generally includes a compression engine 117, sensor 119, and record storage 121. The compression unit 115 has two operational states, a training state, and an operational state. During the training state which is typically performed only once, compression unit 115 is activated to record a flow of messages over the CAN-bus 113. More specifically, sensor 119 "listens" to the flow of information over the CAN-bus during a period $T_1$ of, for example, 1 hour. The flow of the messages during the period $T_1$ is recorded by the compression engine 117 and stored within a record storage 121. Next, still during the training state, the compression engine 117 (or any other processor which may be external of the CAN-bus) analyzes the flow, determines various types of functions within the record, and performs indexing for various values and fields within messages frames, as will be elaborated with respect to FIG. 3. The transmission unit 123 communicates with a remote location or with a local maintenance device to export the compressed CAN-bus data.

In general, the present invention relates to a method for compressing a flow of CAN-bus messages, which comprises the steps of:

during a training stage:
  determining at least one series-type pattern within a training flow of messages, each series-type pattern spanning data values that appear in a data field of a sequential series of CAN-bus messages having a same message-ID. The patterns may be either values that follow some function pattern, or specific (constant) values that repeatedly appear within data fields (or a portion thereof) of sequential (series) of messages having a same message-ID;
  defining a compressed series-type command for each of said patterns, each series type command comprising parameters selected from: (a) a timestamp of a first message in the series; (b) a message-ID of the series; (c) a type of pattern; (d) an indication of a field or a portion thereof within the messages where the pattern appears; (d) a parameter value at the first message in the series; (e) period between messages of the series; and (f) number of messages in the series;

during a compression stage:
  dividing a record of a flow of CAN-bus messages into groups, each group relating to messages having a same message-ID; within each group, finding one or more series of messages of a same pattern, each series spanning, for example, at least 5 messages. It should be noted that a series of messages that meet some pattern is generally much larger than 5, and can reach hundreds, even thousands of messages;
  for each said found series of messages, forming a series-type compressed command in a form as defined in the training stage, said compressed series-type command comprising values for at least several of the parameters as defined for that command during the training stage; and during a decompression stage:
  using each said series-type compressed command to reconstruct at least a portion of the content of a respective series of messages, wherein said compressed command populates respective values within a respective field or a portion thereof of each individual of said reconstructed messages.

Figure 3:
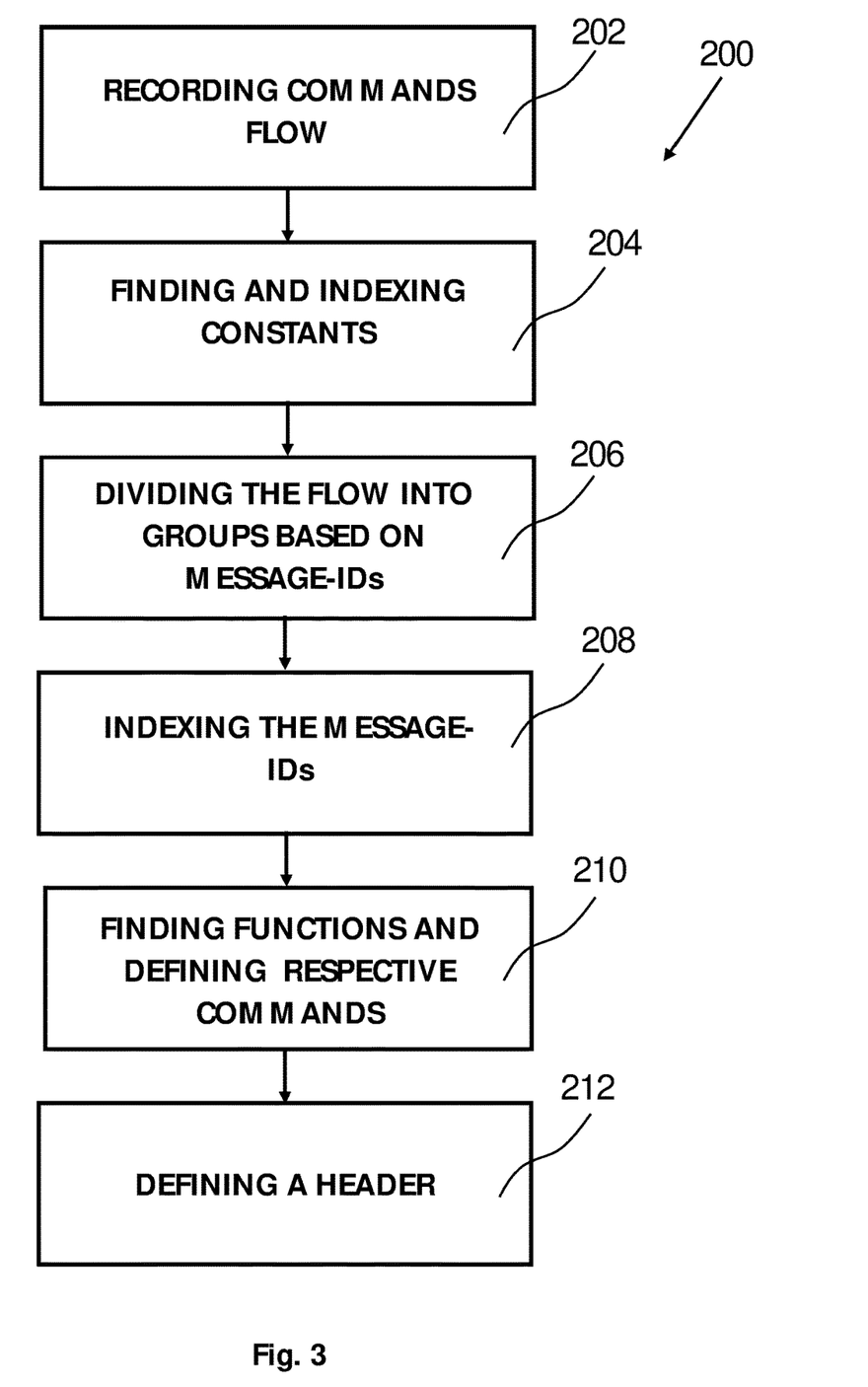
FIG. 3 generally illustrates a training procedure according to an embodiment of the invention.

FIG. 3 generally illustrates a training procedure 200 of the invention. In step 202, a flow of messages on the CAN-bus is recorded and stored. In step 204, specific data values that are found to repeat many times within the message-flow record (hereinafter, also referred to as "constants"), and irrespective of the message-IDs, are determined. These determined data values may span either the entire data field 27 (FIG. 1b) of the message frame or a portion thereof. Those data values that are found to be most common are indexed. For example, if 32 of such repeating data values are found, they receive distinct indices from 0 to 31, an index space that spans 5 bits. In such a manner, a data value (pattern) that normally spans, for example, 6 or 8 bytes can be represented by 5 bits. The fact that those patterns repeat many times, sometimes thousands of times within a one-minute record of CAN messages leads to significant compression.

Next, the entire record is divided (step 206) into a plurality of sub-flows, each sub-flow represents only messages of a single message-ID. The collection of all the message-IDs that are found within the record are then sequentially indexed (step 208). While the message-ID field spans up to 4 bytes (11 bits or 29 bits) in the message frame (see FIG. 1b), and assuming that in average there are no more than 64 different message-IDs in the network, the entire space of all the message-IDs can be represented by only 6 bits (or by 7 bits in relatively rare cases). This indexing of the message-IDs also results in significant compression.

Next, in step 210 various types of functions that appear within the messages are determined. A function is defined as y=(f)x. If a function is determined and known, and the data fields in messages of a series of messages relating to the same ID follows this function, it becomes possible to determine all the data field values within the entire series of messages, given a single value of one message. The following are just examples for functions that typically appear within the CAN-bus traffic: (a) constant; (b) counter; (c) CRC; etc. In addition, specific compressed commands are also defined in step 210 for each function, respectively, as will be elaborated hereinafter.

In step 212 a header is defined. The header includes metadata which is transferred for each compressed record from the compression engine 117 to the remote control-center, together with the compressed data. The metadata includes, for example, the various indexing tables, the definition of the functions, and any other information that may be necessary for the monitoring center to reconstruct the messages, given the compressed commands of the data file.

Figure 4:
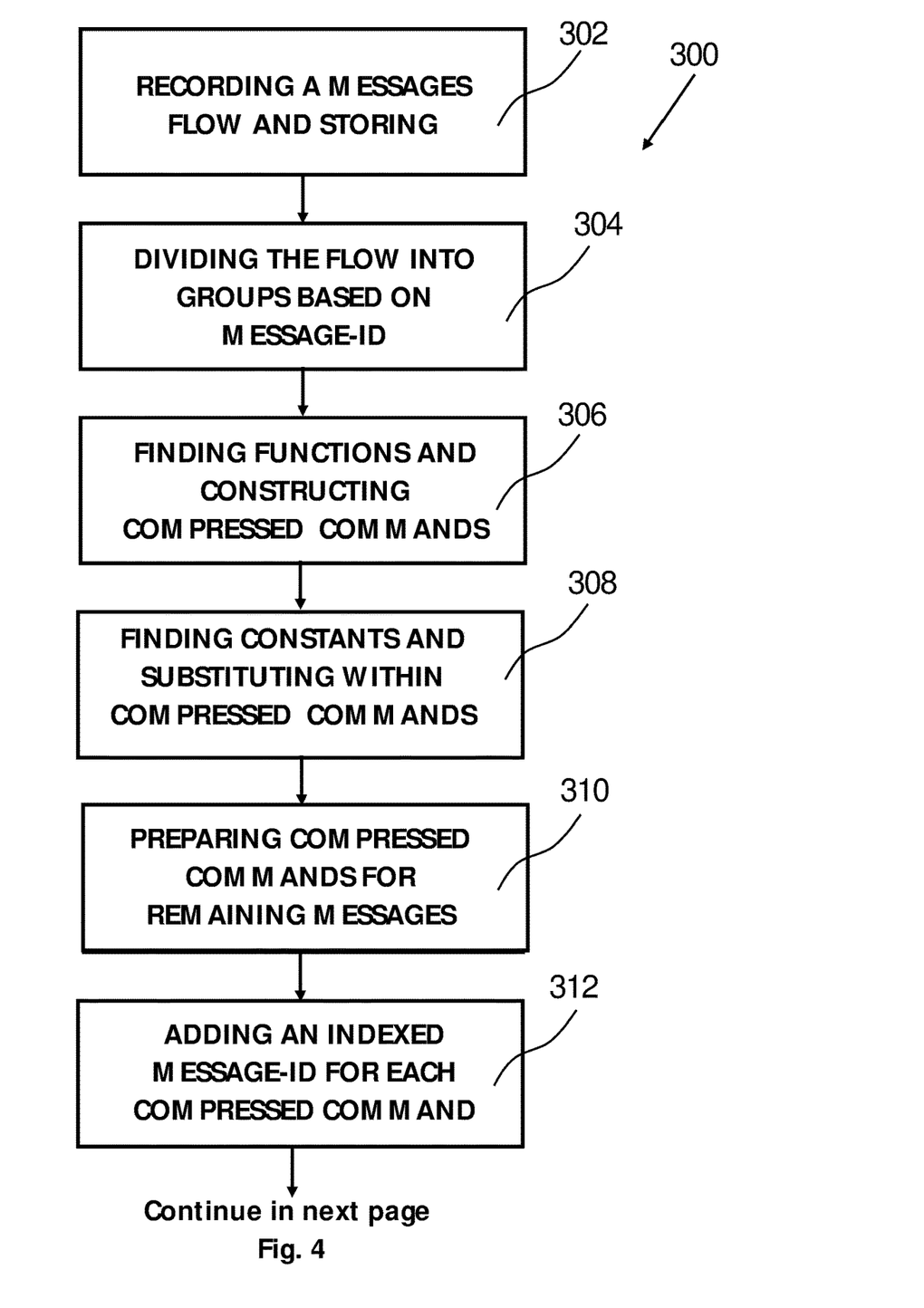
FIG. 4 generally illustrates the operational stage of the compression unit, according to an embodiment of the invention.

FIG. 4 generally illustrates the operational stage 300 of the compression unit 115. In stage 302 a traffic of messages over the CAN-bus is recorded and stored within the record storage 121 of the compression unit. Next, in step 304, the recorded flow of messages is divided into separate groups, each group containing messages of the same message-ID. In step 306, the original messages in each of the groups are analyzed separately, to find whether their data fields reflect any of the functions defined in step 210 of FIG. 2. As previously noted, the functions may be, for example, a counter function, a data-field CRC function, a constant function, or any other defined function. If a function is indeed found within a series of messages forming the entire group, or within a series of messages forming a portion of the group, a specific compressed function-type command is formed by the compression engine 117 to describe the entire found series. The command is still not complete at this stage, waiting for completion in following one or more steps. In some cases, when a function occupies only a portion of the data field in a series of messages, the rest of the data field may be completed, for example, by indices of constants within the same compressed command, or by additional compressed commands that separately target these constants.

In step 308, the compression engine 117 continues to inspect each message group to find whether they contain any of the previously indexed constants that have been found, indexed, and stored in step 204 of FIG. 2. There may be two cases. In the first case, the constants relate to a portion of the data field of the original message (the rest of the data field may include a function-type data). In such a case, the index of that constant may be added to a respective compressed function-type command that has already been created in step 306. In another case, if the constant relates to an entire data field, a separate constant-type command which includes the index of the constant is formed to describe in one command a series of original messages whose data field contains the same data value. In step 310, for any remaining message that does not meet either a constant or a function condition, a separate compressed command which includes the full data field of the respective original message is created.

In step 312, for each compressed command which is formed in a group, the respective index of the message-ID of that group is extracted from the message-IDs index table (as prepared in step 208 of FIG. 2), and substituted in the respective compressed command. As said, this substitution occupies 6 or 7 bits, compared to the 11 or 29 bits in the original CAN-bus messages.

The above procedure is repeated separately for all the ID groups in the record. Next, in step 314 a timestamp is added to each created compressed command. For any function or constant-type message which relates to a series of messages, the timestamp of the first message is included. The number of repetitions and the period in which the message appears are also added and are sufficient for the monitoring center to reconstruct the entire series of messages. However, there may be exceptional cases in which the periodic repetition of the messages within the series is delayed one or more times. As previously noted, this delay may occur, for example, due to a case of conflict in which two separate ECUs try to simultaneously introduce their own messages to the bus. In such a case, the message having the lower message-ID is first transmitted. The other message is delayed and transferred immediately thereafter. A special mechanism is provided to resolve this issue and to enable the monitoring center to accurately assign to each distinct message its own accurate time stamp. This mechanism will be described by way of example.

Example 1

Assume that a functional-type message relates to 500 messages. The first message in the series begins at a timestamp 0.00, and the period between any two messages in the series is 10 μs. The inclusion of the initial timestamp $t_1$ and the period P allows the receiving monitoring center to conclude, for example, that the $101^{st}$ message in the series occurred at time 1000 μs, and that the $500^{th}$ message (i.e., the last message in the series) should receive timestamp of 4990 μs.

Example 2

In similarity to the previous example, assume that a functional-type message relates to 500 messages. The first message in the series begins at a timestamp 0.00, and the period between any two messages in the series is 10 μs. However, a first delay of 3 μs occurred in the $101^{st}$ message, and a second delay of 2 μs occurred in the $301^{st}$ message. Therefore, the series-type compressed message will include, in addition to the previously mentioned initial timestamp $t_1$ and the period P also the two delay parameters (DL:101,+3) and (DL:301,+2). This will allow the monitoring unit to conclude that the first 100 messages in the series appeared with no delay (i.e., the $100^{th}$ message has a timestamp of 990 μs), that all the messages from the $101^{st}$ to the 300 have a delayed timestamp of 3 μs relative to the expected (i.e., the $300^{th}$ message should receive timestamp of 2993 μs), and that all the messages from the $301^{st}$ to the $500^{th}$ should have a delayed timestamp of 5 μs (i.e., the $500^{th}$ message should receive timestamp of 4995 μs). It should be noted that the indication of the delay is preferably relative to an expected timing (as calculated), that a delay may have a positive (+) or in some cases even a negative (−) delay. The fact that a relative value rather than a global is used consumes only a few additional bits (for example, a maximum of 3-4 bits). In some cases, however, the absolute value of the timestamp may be used in the compressed command. Moreover, any number of DL parameters may be included within a single compressed command.

The above procedure is separately repeated IN STEP 316 for all the different groups. Next, in step 318 a header section is prepared. The header section provides to the monitoring center any information which is required for it to reconstruct the entire record of messages, given all said compressed commands. For example, the header may include, among others, all the index tables, a brief description of the functions that have been used while constructing the compressed commands, and any other information or conventional definitions that may be found necessary. It should be noted that the header may be eliminated from the compressed file, in case that the monitoring center already has all the required information which is included in the header (for example due to a previous transfer of a message record for that same car or similar). Finally, in step 320 the compressed file that includes the header, and the compressed commands is transmitted to the remote location. As noted, in some cases the compressed file may be transferred in a hardwire manner, of saved locally within the system for later use.

The method of the invention was tested on various vehicles from both the far east and the US. A rate of compression of 96%-98% was found in both said cases.

Figure 5:
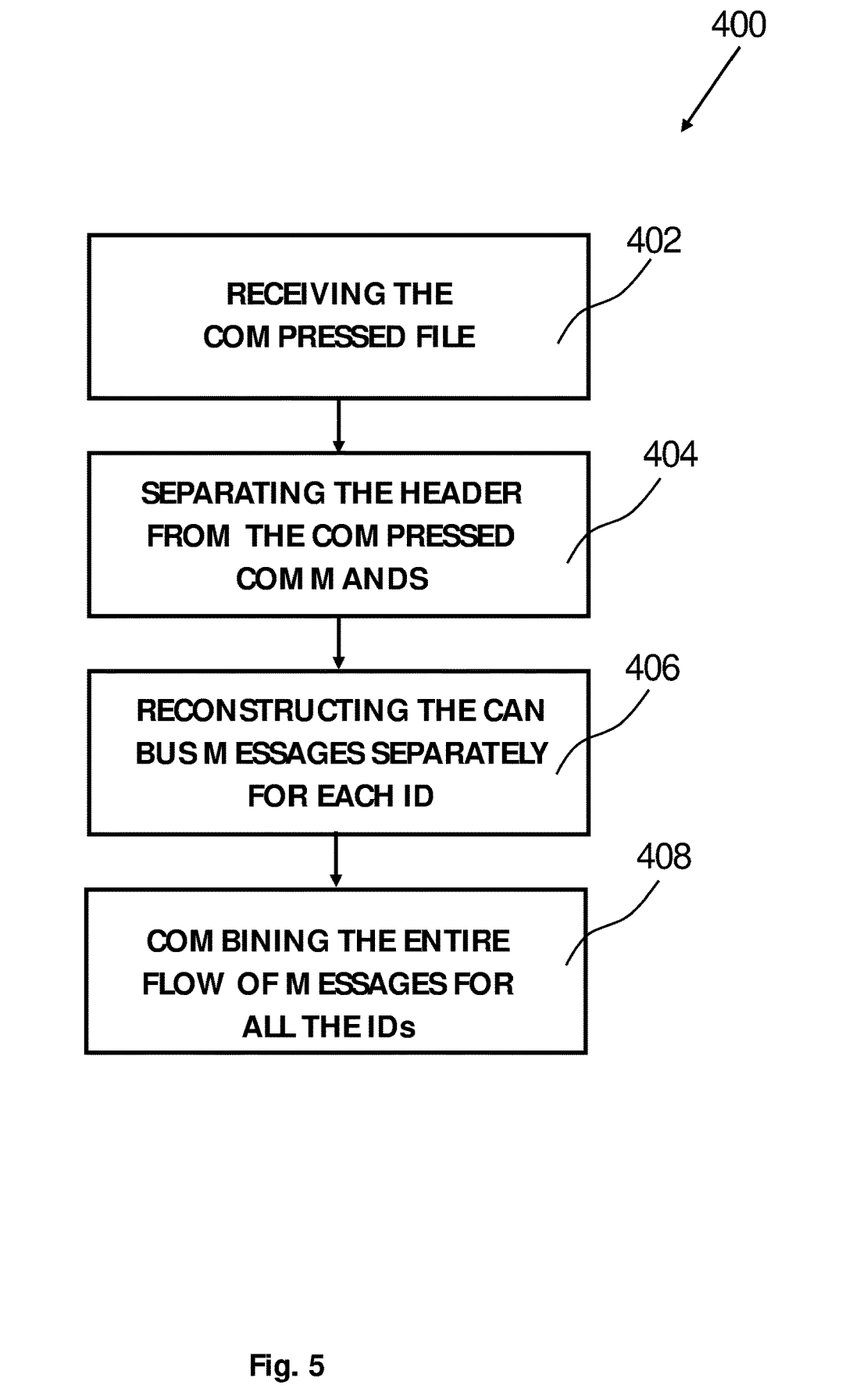
FIG. 5 describes a decompression process that is performed at the remote monitoring center, according to an embodiment of the invention.

FIG. 5 describes the decompression process 400 which is performed at the remote monitoring center, according to an embodiment of the invention. In step 402, the compressed file is received at the monitoring center. In step 404, the header is separated from the compressed commands. In step 406, and given the header information and the compressed commands, the flow is of messages is reconstructed separately for each ID. Finally, in step 408 the separate flows, that were previously reconstructed for each ID, are combined to reconstruct the entire flow that resembles the original flow that was recorded at the vehicle.

Example 3

As an example, the following compressed commands may be used:

IDN(ID, TS, DLC, DATA, TI, N, DL]

This compressed command is designed to generate a series of messages, each message with the same constant data value.

ID—CAN message indexed ID;
TS—Timestamp of the first message in the series (global timestamp);
DLC—Data length in bytes;
DATA—Data bytes content;
TI—Time interval (P) between commands;
N—Number of commands in the series;
DL—One or more delays (in a relative period compared to the expected);

BYTE_DATA_CONST(ID, TS, DI, DATA, TI, N, DL)

This compressed command is designed to populate data byte/s $DI_{1-n}$ in a series of messages of the same ID with a given value DATA.

TS—Timestamp of the first message in the series (global timestamp);
ID—CAN message indexed ID;
$DI_{1-n}$—Data byte index/indices;
DATA—Byte/s data value/s;
TI—Time interval (P) between commands;
N—Number of commands in the series;
DL—One or more delays (in a relative period compared to the expected);

BYTE_DATA_COUNTER(ID, TS, $DI_{1-n}$, IN_VALUE, TI, N, TS)

This compressed command is designed to populate data byte/s $DI_{1-n}$ in a series of messages of the same ID with counter values.

ID—CAN message indexed ID;
TS—Timestamp of the first message in the series (global timestamp);
$DI_{1-n}$—Data byte index/indices;
IN_VALUE—Initial counter value;
N—Number of commands in the series;
TI—Time interval (P) between commands;
DL—One or more delays (in a relative period compared to the expected);

BYTE_DATA CRC(ID, TS, $DI_{1-n}$, IN_VALUE, TI, N, TS)

This compressed command is designed to populate data byte/s $DI_{1-n}$ in a series of messages of the same ID with CRC-function values.

ID—CAN message indexed ID;
TS—Time stamp of the first message in the series (global timestamp);
$DI_{1-n}$—Data byte/s index/indices;
IN_VALUE—Initial counter value;
N—Number of commands in the series;
TI—Time interval (P) between commands;
DL—One or more delays (in a relative period compared to the expected);

BYTE_INDEXED_DATA(ID, TS, $DI_{1-n}$, DATA_INDEX, TI, N, TS)

This compressed command is designed to populate data byte/s $DI_{1-n}$ in a series of messages of the same ID with indexed data values.

ID—CAN message indexed ID;
TS—Timestamp of the first message in the series (global timestamp);
$DI_{1-n}$—Data byte/s index/indices;
INDEXED_DATA—Index of DATA values;
N—Number of commands in the series;
TI—Time interval (P) between commands;
DL—One or more delays (in a relative period compared to the expected);

Alternatively, a single compressed command may be used, in which an appropriate parameter value indicates the type of command. For example, the parameter may include the following values for substitution: CRC, Counter, Constant, etc.

Example 4

Several experiments were performed with the method of the invention over 4 different CAN-buses. The following are the results, compared to a Gzip compression. As can be seen, the original files were compressed by the invention to about 2.4%-3.4% of their original sizes, respectively. The CAN-buses included about 2000 messages per second.

| Present Method | | Gzip* compression | | Original Log | | | |
|---|---|---|---|---|---|---|---|
| Comp. Ratio | File Size (KB) | Compression Ratio | Gzip Compressed (KB) | File Size (KB) | # of Messages | # of Unique IDs | Test # |
| 2.4% | 2,579 | 17.08% | 18,334 | 107,352 | 1,582,986 | 131 | File1 |
| 2.4% | 3,142 | 17.33% | 22,410 | 129,300 | 1,906,057 | 98 | File2 |
| 3.2% | 7020 | 14.80% | 32,247 | 217,904 | 3,404,755 | 129 | File3 |
| 3.4% | 7,973 | 15.45% | 36,234 | 234,503 | 3,664,108 | 97 | File4 |

*Gzip is a state of the art syntactic compression method.

As shown, the invention provides a very efficient method for compressing a CAN-bus flow of messages. A rate of compression of 96%-98% was obtained in experiments. The invention may be carried out by the use of a few compressed commands to describe the entire original flow of messages.

While some embodiments of the invention have been described by way of illustration, it will be apparent that the invention can be carried into practice with many modifications, variations, and adaptations, and with the use of numerous equivalent or alternative solutions that are within the scope of persons skilled in the art, without departing from the spirit of the invention or exceeding the scope of the claims.

The invention claimed is:

1. A method, comprising:
   during a training stage:
      determining and assigning an index to at least one function-type pattern within a training flow of messages, each of the at least one function-type pattern spanning data values that appear in a data field of a sequential series of Controller Area Network (CAN-bus) messages having a same message-ID;
      defining a function-type compressed command for each of said function-type patterns, each function-type compressed command comprising a message-ID of the series, an index of the respective function-type pattern, a parameter for a value indication at a message in the series, a period between messages of the series, and a number of messages in the series;
   during a compression stage:
      dividing a record of a flow of CAN-bus messages into groups, each group relating to messages having a same message-ID;
      within each group, finding one or more series of messages of a same function-type pattern, each series spanning at least 5 messages;
      for each series of messages that is found, forming said function-type compressed command in a form as defined in the training stage, said function-type compressed command comprising values for at least several of the parameters as defined for that function-type compressed command during the training stage; and
   during a decompression stage:
      using said function-type compressed command to reconstruct at least a portion of content of a respective series of messages, wherein said function-type compressed command populates respective values within a respective data field or a portion thereof of each individual of said reconstructed messages.

2. The method of claim 1, wherein the function-type pattern appears within a data field of the message or within a portion thereof.

3. The method of claim 2, wherein a function is a counter function or a data-field cyclic redundancy check (CRC) function causing respectively a function-type pattern of values to appear within one or more data fields or portion thereof of consecutive messages of a same message ID, and wherein the decompression stage populates said values within respective one or more data fields of the reconstructed series of messages.

4. The method of claim 1, wherein the function-type pattern is a constant value appearing within a data field of a message or within a portion thereof, and wherein during the decompression stage said function-type compressed command populates said constant value within the respective data field of the reconstructed series of messages.

5. The method of claim 4, wherein the training stage further comprises:
   determining a plurality of constant values that statistically repeat a plurality of times in one or more data fields of messages or portions thereof;
   sequentially indexing constant values that most commonly appear; and
   wherein each constant-type command during the compression stage contains an index of one or more of the constant values rather than a respective constant value itself.

6. The method of claim 1, further comprising:
   a step of indexing all the IDs in the training flow of the CAN-bus messages in sequential order; and
   during the compression stage inclusion within each function-type compressed command the index of the ID, rather than a true message-ID as originally appears on the CAN-bus.

7. The method of claim 1, further comprising an inclusion within the function-type compressed command of one or more delay indications relative to an expected timestamp based on a known period between function-type compressed commands in that respective series.

8. The method of claim 1, further comprising one or more compressed commands for introducing one or more specific values within one or more data fields of individual reconstructed messages.

9. The method of claim 1, wherein a plurality of said function-type compressed commands reconstruct a single CAN-bus message.

10. The method of claim 1, wherein a different function-type compressed command is assigned for each function-type pattern, rather than indicating the index of the function-type pattern as a parameter value within the function-type compressed command.

11. The method of claim 1, wherein the decompression of the function-type compressed commands uses metadata that is conveyed from a compression location to a decompression location within a header.

12. The method of claim 11, wherein the header's metadata contains one or more of: indexing information of the message-IDs, indexing information of constants, and details about specific functions behavior thereby to enable a decompression side to convert the function-type compressed command to values within one or more data fields of different reconstructed messages.

13. The method of claim 1, wherein said defining of the function-type compressed command further comprises an indication of a data field or a portion thereof within the messages where the function-type pattern appears.

14. The method of claim 1, wherein each function-type command further comprises a timestamp of a message in the sequential series.

15. A non-transitory computer-readable medium storing instructions that, when executed by a processor, cause the processor to perform operations comprising:
during a training stage:
determining and assigning an index to at least one function-type pattern within a training flow of messages, each function-type pattern spanning data values that appear in a data field of a sequential series of Controller Area Network (CAN-bus) messages having a same message-ID;
defining a function-type compressed command for each of said function-type patterns, each function-type compressed command comprising a message-ID of the series, an index of the respective function-type pattern, a parameter for a value indication at a message in the series, a period between messages of the series, and a number of messages in the series;
during a compression stage:
dividing a record of a flow of CAN-bus messages into groups, each group relating to messages having a same message-ID;
within each group, finding one or more series of messages of a same function-type pattern, each series spanning at least 5 messages;
for each series of messages that is found, forming said function-type compressed command in a form as defined in the training stage, said function-type compressed command comprising values for at least several of the parameters as defined for that function-type compressed command during the training stage; and
during a decompression stage:
using said function-type compressed command to reconstruct at least a portion of content of a respective series of messages, wherein said function-type compressed command populates respective values within a respective data field or a portion thereof of each individual of said reconstructed messages.

16. A computer system with a memory storing instructions and a processor configured to execute the instructions to perform a method, comprising:
during a training stage:
determining and assigning an index to at least one function-type pattern within a training flow of messages, each function-type pattern spanning data values that appear in a data field of a sequential series of Controller Area Network (CAN-bus) messages having a same message-ID;
defining a function-type compressed command for each of said function-type patterns, each function-type compressed command comprising a message-ID of the series, an index of the respective function-type pattern, a parameter for a value indication at a message in the series, a period between messages of the series, and a number of messages in the series;
during a compression stage:
dividing a record of a flow of CAN-bus messages into groups, each group relating to messages having a same message-ID;
within each group, finding one or more series of messages of a same function-type pattern, each series spanning at least 5 messages;
for each series of messages that is found, forming said function-type compressed command in a form as defined in the training stage, said function-type compressed command comprising values for at least several of the parameters as defined for that function-type compressed command during the training stage; and
during a decompression stage:
using said function-type compressed command to reconstruct at least a portion of content of a respective series of messages, wherein said function-type compressed command populates respective values within a respective data field or a portion thereof of each individual of said reconstructed messages.

* * * * *